United States Patent
Jang et al.

(10) Patent No.: US 6,524,906 B2
(45) Date of Patent: *Feb. 25, 2003

(54) CHEMICAL MECHANICAL POLISHING OF POLYSILICON PLUG USING A SILICON NITRIDE STOP LAYER

(75) Inventors: Syun-Ming Jang, Hsin-Chu (TW); Chung-Long Chang, Dou-Liu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 109 days.

This patent is subject to a terminal disclaimer.

(21) Appl. No.: 09/774,416

(22) Filed: Feb. 1, 2001

(65) Prior Publication Data

US 2001/0019887 A1 Sep. 6, 2001

Related U.S. Application Data

(63) Continuation of application No. 09/216,788, filed on Dec. 21, 1998, now Pat. No. 6,200,875.

(51) Int. Cl.$^7$ .......................................... H01L 21/8242
(52) U.S. Cl. ...................................... 438/253; 438/396
(58) Field of Search ................................ 438/396, 397, 438/239, 243, 250, 253

(56) References Cited

U.S. PATENT DOCUMENTS

| | | | |
|---|---|---|---|
| 5,229,326 A | | 7/1993 | Dennison et al. ............ 438/586 |
| 5,279,989 A | * | 1/1994 | Kim ............................ 438/396 |
| 5,318,663 A | * | 6/1994 | Buti et al. ................... 438/404 |
| 5,700,706 A | | 12/1997 | Juengling .................... 438/253 |
| 5,759,917 A | | 6/1998 | Grover et al. ............... 438/690 |
| 6,001,682 A | * | 12/1999 | Chien ......................... 438/397 |
| 6,008,084 A | * | 12/1999 | Sung ........................... 438/396 |
| 6,008,085 A | * | 12/1999 | Sung et al. ................... 438/253 |
| 6,037,213 A | * | 3/2000 | Shih et al. ................... 438/396 |
| 6,060,353 A | * | 5/2000 | Koh ............................ 438/396 |
| 6,103,569 A | * | 8/2000 | Teo et al. .................... 438/396 |
| 6,200,875 B1 | * | 3/2001 | Jang et al. ................... 438/396 |

OTHER PUBLICATIONS

S. Wolf et al., Silicon Processing for the VLSI Era, vol. 1, p. 194, Lattice Press, 1986.*

* cited by examiner

Primary Examiner—Wael Fahmy
Assistant Examiner—Anh Duy Mai
(74) Attorney, Agent, or Firm—George O. Saile; Stephen B. Ackerman; Rosemary L. S. Pike

(57) ABSTRACT

A method for controllably simultaneously polishing polysilicon and oxide using an oxide slurry and a polish stop layer over the oxide is described. Semiconductor device structures are provided in and on a semiconductor substrate. An oxide layer is deposited overlying the semiconductor device structures. A silicon nitride layer is deposited overlying the oxide layer as a polish stop layer. A contact opening is etched through the silicon nitride layer and the oxide layer to one of the semiconductor device structures. A polysilicon layer is deposited overlying the silicon nitride layer and within the contact opening. The polysilicon layer is polished until the silicon nitride layer is contacted and then the polysilicon layer, silicon nitride layer, and oxide layer are overpolished in a timed polish to remove the silicon nitride layer and planarize the oxide layer to complete simultaneous planarization of the oxide and polysilicon layers in the fabrication of an integrated circuit device.

7 Claims, 4 Drawing Sheets

CHEMICAL MECHANICAL POLISHING OF POLYSILICON PLUG USING A SILICON NITRIDE STOP LAYER

This is a continuation of application Ser. No. 09/216,788 filed Dec. 21, 1998 now U.S. Pat. No. 6,200,875.

BACKGROUND OF THE INVENTION (1) Field of the Invention

The present invention relates to a method of chemical mechanical polishing and, more particularly, a method of chemical mechanical polishing using an oxide slurry and a polish stop layer to polish both polysilicon and oxide simultaneously in the fabrication of an integrated circuit device.

(2) Description of the Prior Art

Dynamic random access memory (DRAM) devices are widely used in the art. The formation of polysilicon cylindrical capacitors is becoming important. Often, a polysilicon plug is used to form the bottom portion of the cylindrical capacitor. Chemical mechanical polishing (CMP) is routinely used to planarize the polysilicon plugs. However, this demands a polysilicon slurry and may demand a dedicated polisher for polysilicon. It would simplify the process to use an oxide slurry for CMP of the polysilicon plug. Oxide slurry easily removes polysilicon as well. The drawback to this idea is that the oxide slurry easily removes both the polysilicon and the inter-poly oxide (IPO) leading to uncontrollable depth of the polysilicon plug and uncontrollable IPO thickness. It is suggested to employ a polish stop layer before patterning of the polysilicon plug. This would allow polishing of the polysilicon and oxide using an oxide slurry but without polishing away the IPO.

Polish stop layers have been widely used in the art. For example, U.S. Pat. No. 5,759,917 to Grover et al discloses an oxide CMP process using a silicon nitride stop layer to form shallow trench isolation. U.S. Pat. No. 5,229,326 to Dennison et al teaches a poly plug process in which the IPO layer is first subjected to CMP, then polysilicon is deposited and CMP to form poly plugs. This process requires two CMP steps and does not use a stop layer. U.S. Pat. No. 5,700,706 to Juengling teaches a simultaneous CMP of polysilicon and BPSG, but does not use a stop layer.

SUMMARY OF THE INVENTION

Accordingly, it is a primary object of the invention to provide an effective and very manufacturable process for controllably simultaneously polishing polysilicon and oxide.

Another object of the present invention is to provide a method for controllably simultaneously polishing polysilicon and oxide using a polish stop layer over the oxide.

Another object of the present invention is to provide a method for controllably simultaneously polishing polysilicon and oxide using a silicon nitride polish stop layer over the oxide.

Yet another object of the present invention is to provide a method for controllably simultaneously polishing polysilicon and oxide using an oxide slurry and a polish stop layer over the oxide.

Yet another object is to provide a method for fabricating a cylindrical capacitor using a polysilicon plug in which the inter-poly oxide and the polysilicon plug can be polished simultaneously and controllably.

A further object is to provide a method for fabricating a cylindrical capacitor using a polysilicon plug in which the inter-poly oxide and the polysilicon plug can be polished with an oxide slurry simultaneously and controllably.

A still further object is to provide a method for fabricating a cylindrical capacitor having a polysilicon plug in which the inter-poly oxide and the polysilicon plug can be polished with an oxide slurry simultaneously and controllably using a polish stop layer over the inter-poly oxide.

In accordance with the objects of this invention, a method for controllably simultaneously polishing polysilicon and oxide using an oxide slurry and a polish stop layer over the oxide is achieved. Semiconductor device structures are provided in and on a semiconductor substrate. An oxide layer is deposited overlying the semiconductor device structures. A silicon nitride layer is deposited overlying the oxide layer as a polish stop layer. A contact opening is etched through the silicon nitride layer and the oxide layer to one of the semiconductor device structures. A polysilicon layer is deposited overlying the silicon nitride layer and within the contact opening. The polysilicon layer is polished until the silicon nitride layer is contacted and then the polysilicon layer, silicon nitride layer, and oxide layer are overpolished in a timed polish to remove the silicon nitride layer and planarize the oxide layer to complete simultaneous planarization of the oxide and polysilicon layers in the fabrication of an integrated circuit device.

BRIEF DESCRIPTION OF THE DRAWINGS

In the following drawings forming a material part of this description, there is shown.

DESCRIPTION OF THE PREFERRED EMBODIMENTS

The process of the present invention can be used in fabricating a cylindrical capacitor of a DRAM device. This application will be described below and illustrated with FIGS. 1 through 9. However, it will be understood by those skilled in the art that the process of the invention is not limited to the application herein described. Specifically, the process of the invention can be used in any application in which it is desired to controllably simultaneously polish both an oxide and a polysilicon layer.

Figure 1:
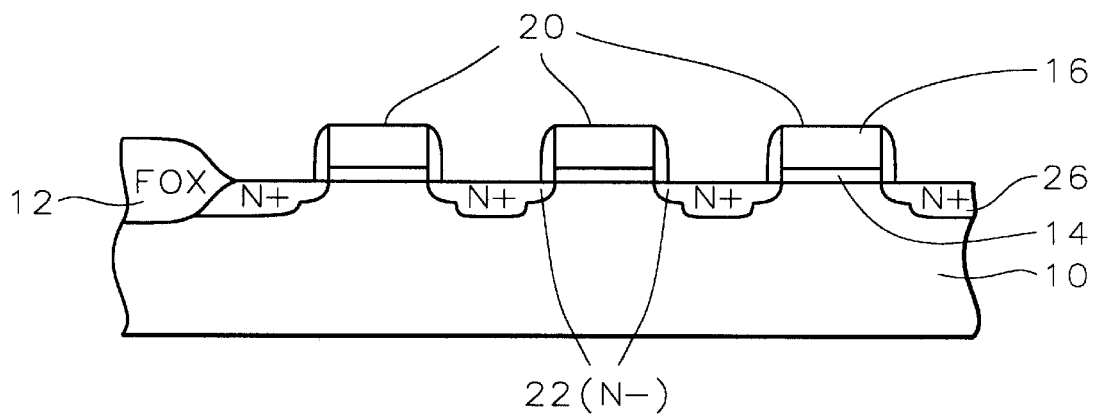
FIGS. 1 through 9 are schematic cross-sectional representations of a preferred embodiment of the present invention.

Referring to FIGS. 1–9, the DRAM application of the present invention will be described. Referring now more particularly to FIG. 1, there is shown a semiconductor substrate 10, preferably composed of silicon having a (100) crystallographic orientation. In an effort to simplify the description and the drawings the dielectric isolation between devices has been only partially shown and will not be described in detail, because they are conventional. For example, field oxide regions 12 are formed in and on the semiconductor substrate.

The surface of the silicon substrate 10 is thermally oxidized to form the desired gate oxide 14 thickness. The preferred thickness is between about 80 to 200 Angstroms. The polysilicon layer 16 is blanket deposited by low pressure chemical vapor deposition (LPCVD) to a preferred thickness of between about 1500 to 3500 Angstroms. The layers 14 and 16 are patterned by lithography and anisotropic etching techniques as are conventional in the art to provide a desired pattern of gate electrodes and word lines 20 as seen in FIG. 1.

The source/drain structure of the MOS FET may now be formed by the following steps. FIGS. 1 through 10 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

Lightly doped source and drain regions 22 are formed by ion implantation. The dielectric spacer 24 is now to be formed followed by the completion of the lightly doped drain source/drain structures. For example, a tetraethoxysilane (TEOS) oxide LPCVD deposition is preferred to a thickness of between about 1000 to 2000 Angstroms. An anisotropic etching of this layer produces the dielectric spacer layer 24 on the sidewalls of the gate electrodes and word lines 20. The heavily doped source and drain regions 26 are formed by ion implantation, as conventional in the art.

Figure 2:
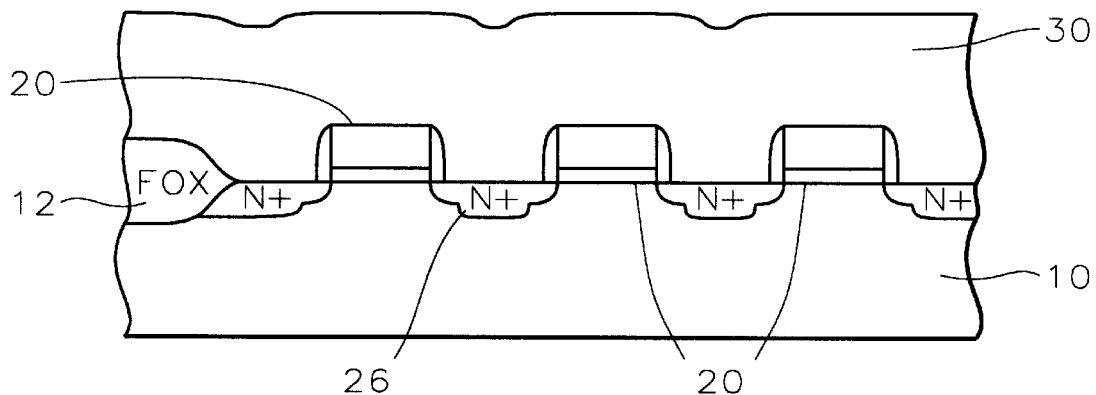

Referring now to FIG. 2, an inter-poly oxide (IPO) layer, such as chemically vapor deposited (CVD) silicon oxide, tetraethoxysilane (TEOS) oxide, high density plasma (HDP) oxide, or the like, 30 is deposited to a thickness of between about 5000 to 10,000 Angstroms.

Typically, the inter-poly oxide layer would be planarized using chemical mechanical polishing (CMP) with an oxide slurry to obtain a flat surface. Later, the polysilicon would be polished using a polysilicon slurry. However, in the process of the present invention, a one-step CMP process can planarize both the polysilicon and the IPO.

Figure 3:
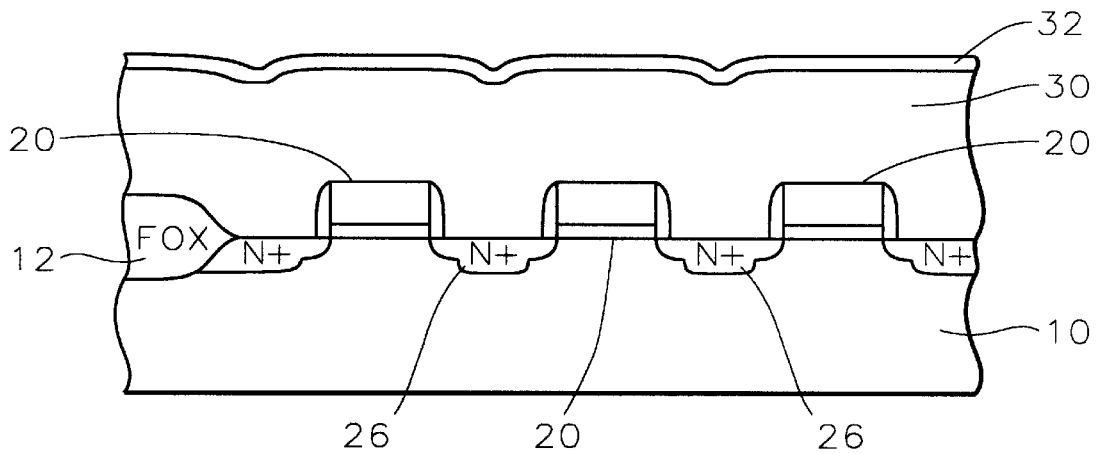

Referring now to FIG. 3, a layer of silicon nitride 32 is deposited over the IPO layer 30 to a thickness of between about 500 and 1500 Angstroms, for example by plasma-enhanced chemical vapor deposition (PECVD) or low pressure chemical vapor deposition (LPCVD). This layer 32 will be the polish stop layer for the CMP process.

Figure 4:
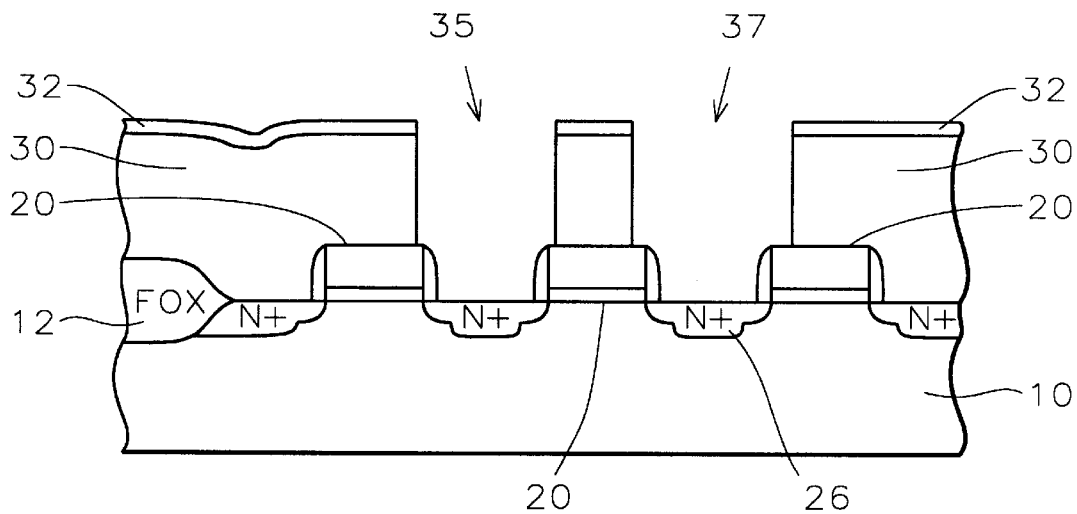

Referring now to FIG. 4, using conventional lithographic and etching techniques, contact openings 35 and 37 are made through the silicon nitride and IPO layers 32 and 30 to the silicon substrate. A bit line will be formed within the contact opening 35. Source/drain region 26 will serve as the node contact region for the capacitor structure to be fabricated within the opening 37.

Figure 5:
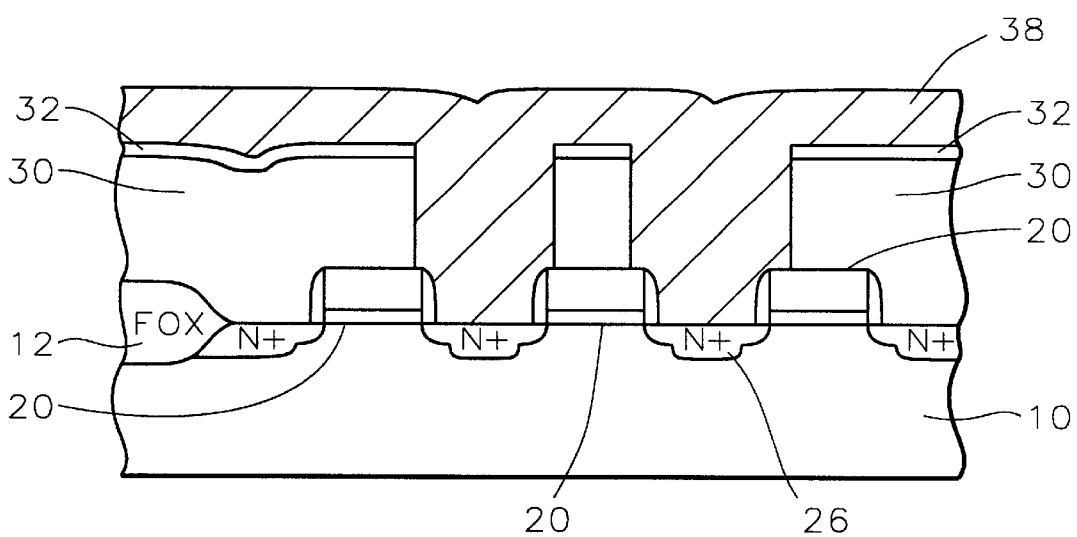

A polysilicon layer 38 is deposited over the silicon nitride layer 32 and within the openings 35 and 37, as illustrated in FIG. 5. The polysilicon layer may be in situ doped or doped after deposition by ion implantation. The thickness of this layer is between about 2500 and 5500 Angstroms.

Figure 6:
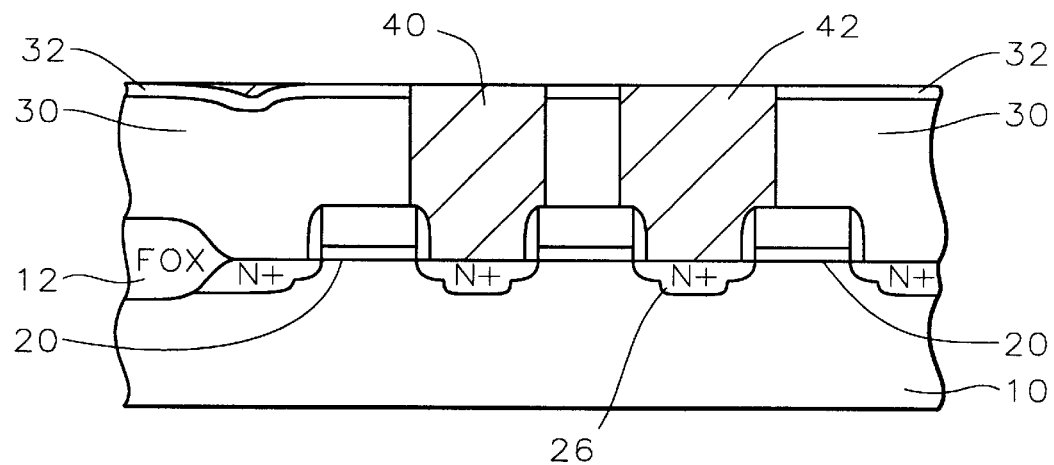

Referring now to FIG. 6 the wafer surface is planarized by CMP using an oxide slurry. The oxide slurry will polish both the oxide and polysilicon. Silicon nitride typically has a polish rate of approximately ⅓ that of oxide. Thus, the silicon nitride layer serves as a polish stop so that the polishing is stopped before it removes the IPO layer 30. Polysilicon plugs 40 and 42 have been formed.

Figure 7:
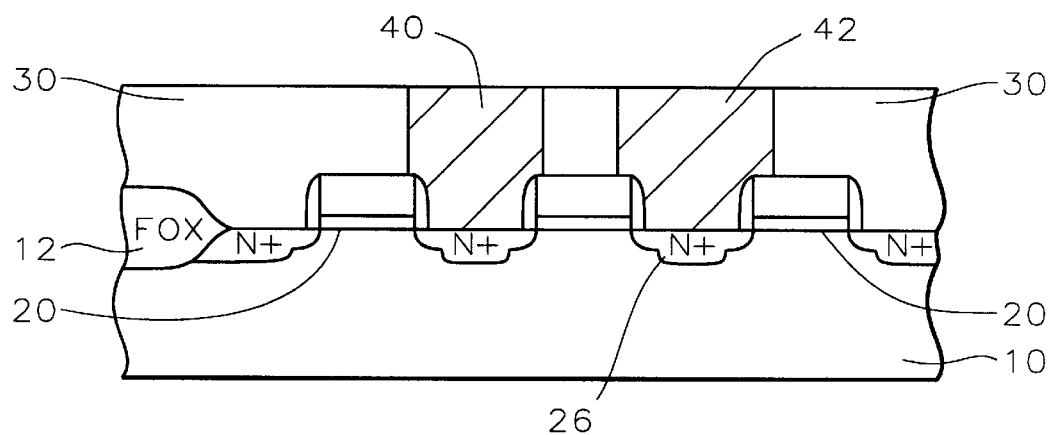

Now, CMP is continued in time mode for between about 80 and 200 seconds to completely remove the silicon nitride layer 32 and planarize the IPO layer 30, as shown in FIG. 7.

Using the method of the present invention, both the IPO and the polysilicon plug layers can be polished simultaneously. The polishing is controllable because the silicon nitride layer acts as a polish stop layer to prevent polishing away of the IPO oxide. The timed overpolish removes the silicon nitride layer and planarizes the IPO layer. No additional slurry is needed to polish the polysilicon plug layer. The oxide slurry is used for the entire polishing cycle. Both oxide and polysilicon CMP can be performed on the same tool. Thus, management of the slurry and the polishing tools is simplified.

Figure 8:
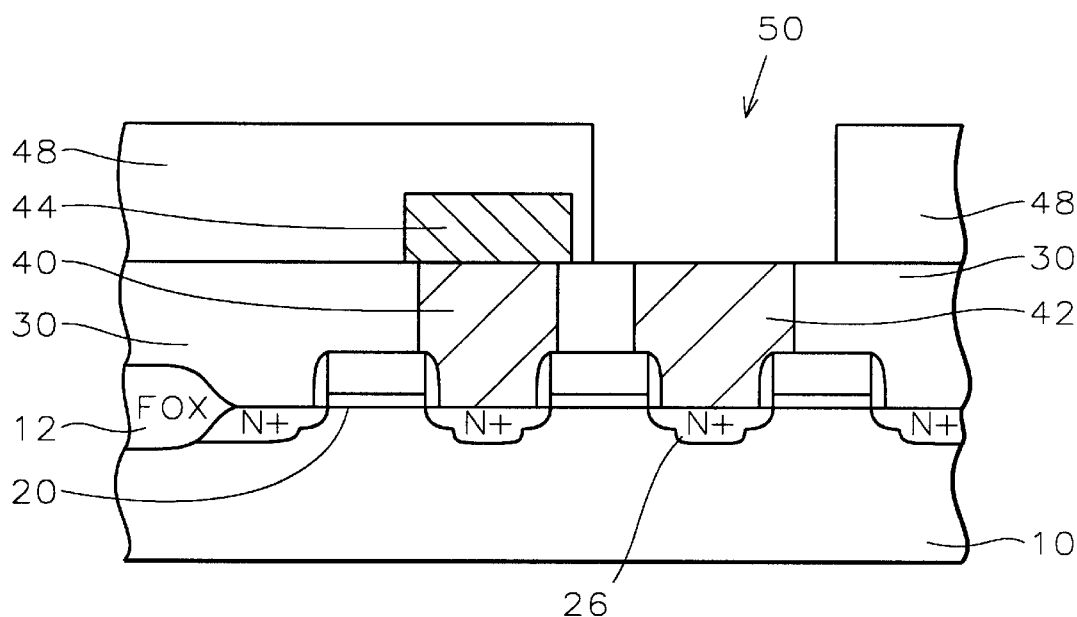

Processing continues as is conventional in the art to form the cylindrical capacitor. For example, a second layer of polysilicon 44 is deposited and patterned as shown in FIG. 8 to complete the bit line contact 40/44. A second interpoly oxide layer 48, typically CVD oxide, PECVD TEOS oxide, or BP-TEOS oxide, is deposited to a thickness of between about 3000 and 9000 Angstroms. The second IPO layer 48 is patterned to provide the cylinder profile 50.

Figure 9:
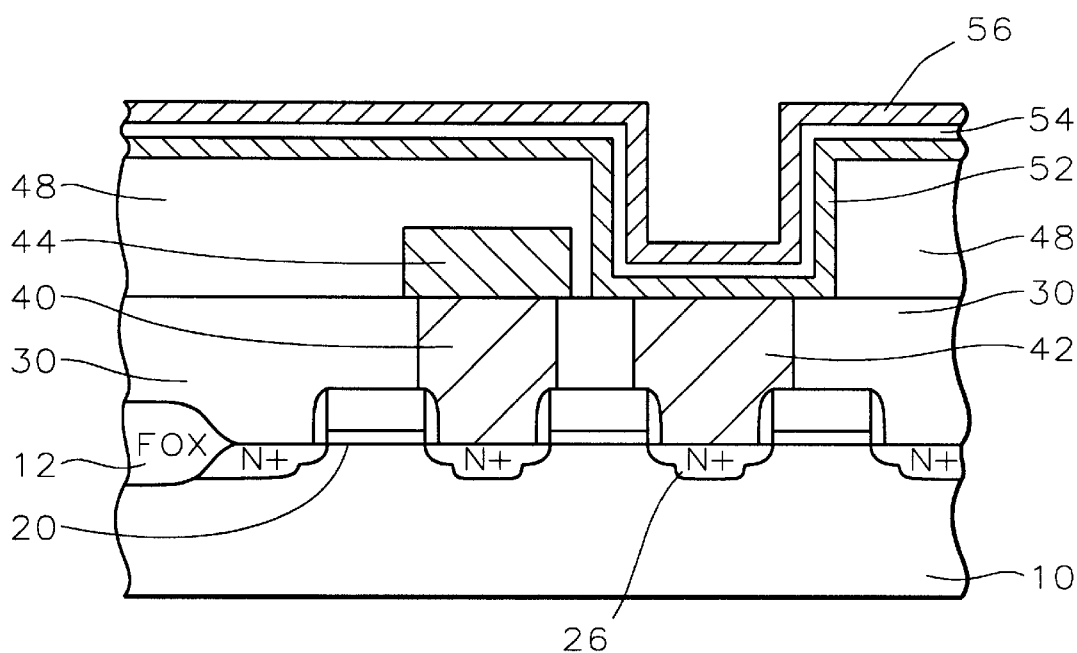

Referring now to FIG. 9, an in-situ doped polysilicon layer 52 is deposited conformally over the surface of the second IPO layer 48 and the polysilicon plug 42 within the opening 50 to a thickness of between about 300 and 1500 Angstroms and polished back to the surface of the second IPO layer. The polysilicon layers 42 and 53 form the bottom plate electrode of the capacitor. Capacitor dielectric layer 54 is deposited conformally over the IPO 48 and polysilicon 52 surfaces. This layer is typically either composed of layers of silicon nitride and silicon oxide (NO) or layers of silicon oxide, silicon nitride and silicon oxide (ONO). The total ONO thickness is in the order of between about 50 to 200 Angstroms.

The top plate electrode is formed by depositing a third polysilicon layer 56 such as by LPCVD. The thickness of this layer 56 is between about 300 to 1500 Angstroms. The polysilicon layer 56 is in-situ doped or doped after deposition. This completes the cylindrical DRAM capacitor, as shown in FIG. 9.

The process of the invention may be used in any application in which it is desired to use an oxide slurry to polish away both a polysilicon and an oxide layer, but controllably. The process of the invention simplifies the manufacturing process by allowing the use of a single type of slurry and, as in the example above, a single CMP process can replace the conventional separate oxide and polysilicon CMP processes.

While the invention has been particularly shown and described with reference to the preferred embodiments thereof, it will be understood by those skilled in the art that various changes in form and details may be made without departing from the spirit and scope of the invention.

What is claimed is:

1. A method for planarizing simultaneously an oxide and a polysilicon layer in the fabrication of an integrated circuit device comprising:

providing semiconductor device structures in and on a semiconductor substrate;

depositing an oxide layer overlying said semiconductor device structures;

depositing a silicon nitride layer overlying said oxide layer;

etching a contact opening through said silicon nitride layer and said oxide layer to one of said semiconductor device structures;

depositing a polysilicon layer overlying said silicon nitride layer and within said contact opening;

polishing said polysilicon layer using an oxide slurry until said silicon nitride layer is contacted; and overpolishing said polysilicon layer, said silicon nitride layer, and said oxide layer in a timed polish using same said oxide slurry to remove said silicon nitride layer and planarize said oxide layer to complete said simultaneous planarization of said oxide and said polysilicon layers in the fabrication of said integrated circuit device.

2. The method according to claim 1 wherein said device structures include source/drain and gate field effect transistor structures.

3. The method according to claim 1 wherein said device structures include source/drain and gate field effect transistor structures and wherein said polysilicon layer forms the bottom electrode of a capacitor and further comprising:

forming a capacitor dielectric layer overlying said polysilicon layer; and forming a top polysilicon electrode overlying said capacitor dielectric layer to complete fabrication of a dynamic random access memory cell.

4. The method according to claim 1 wherein said oxide layer has a thickness of between about 5000 and 10,000 Angstroms.

5. The method according to claim 1 wherein said silicon nitride layer is deposited by plasma-enhanced chemical vapor deposition to a thickness of between about 500 and 1500 Angstroms.

6. The method according to claim 1 wherein said silicon nitride layer is deposited by low pressure chemical vapor deposition to a thickness of between about 500 and 1500 Angstroms.

7. The method according to claim 1 wherein said steps of polishing and overpolishing are performed by chemical mechanical polishing.

* * * * *